US009893318B2

(12) United States Patent
Dai et al.

(10) Patent No.: US 9,893,318 B2
(45) Date of Patent: Feb. 13, 2018

(54) ORGANIC LIGHT-EMITTING DIODE, ARRAY SUBSTRATE AND PREPARATION METHOD THEREOF, AND DISPLAY DEVICE

(71) Applicant: BOE TECHNOLOGY GROUP CO., LTD., Beijing (CN)

(72) Inventors: Qing Dai, Beijing (CN); Wenjun Hou, Beijing (CN); Ze Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/436,922

(22) PCT Filed: Sep. 12, 2014

(86) PCT No.: PCT/CN2014/086368
§ 371 (c)(1),
(2) Date: Apr. 20, 2015

(87) PCT Pub. No.: WO2015/196573
PCT Pub. Date: Dec. 30, 2015

(65) Prior Publication Data
US 2016/0126499 A1 May 5, 2016

(30) Foreign Application Priority Data
Jun. 27, 2014 (CN) .......................... 2014 1 0302840

(51) Int. Cl.
*H01L 27/12* (2006.01)
*H01L 51/52* (2006.01)
(Continued)

(52) U.S. Cl.
CPC ...... *H01L 51/5262* (2013.01); *H01L 27/3211* (2013.01); *H01L 27/3248* (2013.01);
(Continued)

(58) Field of Classification Search
USPC ............................................... 257/40; 438/29
See application file for complete search history.

(56) References Cited

U.S. PATENT DOCUMENTS 8,921,473 B1 * 12/2014 Hyman .................... C08K 3/04
423/445 R
2006/0051914 A1 * 3/2006 Kakehata ............ H01L 21/2022
438/197
(Continued)

FOREIGN PATENT DOCUMENTS

CN  101993032 A  3/2011
CN  102569677 A  7/2012
(Continued)

OTHER PUBLICATIONS

1st office action issued in Chinese application No. 2014103028403 dated Dec. 29, 2015.
(Continued)

*Primary Examiner* — Marcos D Pizarro Crespo
*Assistant Examiner* — Lawrence Tynes, Jr.
(74) *Attorney, Agent, or Firm* — Nath, Goldberg & Myer; Joshua B. Goldberg

(57) ABSTRACT

The present invention relates to an organic light-emitting diode, an array substrate and a preparation method thereof, and a display device. The organic light-emitting diode comprises an anode, a cathode, a light-emitting layer disposed between the anode and the cathode, and a hole injection layer disposed between the anode and the light-emitting layer, wherein the hole injection layer is provided therein with metal nanoparticles, and the frequency of a localized surface plasmon resonance of the metal nanoparticles is matched with the emission wavelength of the light-emitting layer. As the organic light-emitting diode is doped with metal nanoparticles in the hole injection layer and the resonance frequency of the localized surface plas-
(Continued)

mon of the metal nanoparticles is matched with the emission wavelength of the light-emitting layer, the metal nanoparticles are allowed to generate localized plasma resonance with photons, so that the light extraction efficiency of the organic light-emitting diode is enhanced.

18 Claims, 2 Drawing Sheets

(51) Int. Cl.
    *H01L 27/32* (2006.01)
    *H01L 51/00* (2006.01)
    *H01L 51/50* (2006.01)
    *H01L 51/56* (2006.01)
    *H01L 29/786* (2006.01)
    *H01L 21/67* (2006.01)
    *H01L 21/673* (2006.01)
    *H01L 27/146* (2006.01)
    *G06F 3/06* (2006.01)
    *G11C 11/419* (2006.01)
    *G11C 11/418* (2006.01)

(52) U.S. Cl.
    CPC ...... *H01L 51/0004* (2013.01); *H01L 51/5056* (2013.01); *H01L 51/5088* (2013.01); *H01L 51/56* (2013.01); *H01L 2227/323* (2013.01); *H01L 2251/301* (2013.01); *H01L 2251/5369* (2013.01)

(56) References Cited

U.S. PATENT DOCUMENTS

2006/0078761 A1* 4/2006 Williams ............... H01B 1/127
    428/690
2006/0131562 A1* 6/2006 Li ........................ H01L 51/002
    257/40
2008/0231178 A1* 9/2008 Park .................... H01L 51/5088
    313/504
2011/0062481 A1* 3/2011 Oyamada ............... B82Y 20/00
    257/98
2012/0313129 A1 12/2012 Zettsu et al.

FOREIGN PATENT DOCUMENTS

| CN | 103490018 A | 1/2014 |
| CN | 203466191 U | 3/2014 |
| CN | 103872261 A | 6/2014 |
| CN | 204029875 U | 12/2014 |
| EP | 2 287 939 A1 | 2/2011 |
| JP | 2007-242927 A | 9/2007 |
| KR | 10-2013-0125957 A | 11/2013 |

OTHER PUBLICATIONS

Xie Wen-fa, et al., "High efficiency Organic Photoelectric Devices with Metal Nanoparticles", Chinese Journal of Luminescence, May 2013, vol. 34, No. 5.

Y. Xiao, et al., "Surface plasmon-enhanced electroluminescence in organic light-emitting diodes incorporating Au nanoparticles", Applied Physics Letters 100, 013308 (2012); doi: 10.1063/1.3675970.

Search Report issued in International Application No. PCT/CN2014/086368 dated Nov. 28, 2014 (Nov. 28, 2014).

Yangna Shen, "Properties of Metal Nanoparticles and Their Application", Master degree theses of master of China excellent full-text database (a collection of science and technology), Apr. 30, 2012 (Apr. 30, 2012), p. 7-9.

* cited by examiner

ORGANIC LIGHT-EMITTING DIODE, ARRAY SUBSTRATE AND PREPARATION METHOD THEREOF, AND DISPLAY DEVICE

This is a National Phase Application filed under 35 U.S.C. 371 as a national stage of PCT/CN2014/086368, filed Sep. 12, 2014, and claims priority benefit from Chinese Application No. 201410302840.3, filed Jun. 27, 2014, the content of each of which is hereby incorporated by reference in its entirety.

FIELD OF THE INVENTION

The present invention belongs to the field of display technology, and particularly relates to an organic light-emitting diode, an array substrate and a preparation method thereof, and a display device.

BACKGROUND OF THE INVENTION

Organic Light-Emitting Diodes (OLEDs) are honored as a new generation of flat panel displays. In comparison to current mainstream Liquid Crystal Displays (LCDs), the organic light-emitting diodes have the advantages of self illumination, wide angle of view, high contrast ratio, short response time, thin panel thickness (flattening), flexible display and the like. The basic structure of an organic light-emitting diode comprises an anode, a cathode and a light-emitting layer between the anode layer and the cathode layer. Under the action of an external voltage, electrons and holes are injected from the cathode and the anode respectively, then are transferred and encounter with each other in the light-emitting layer to generate excitons. The energy of the excitons is attenuated in the form of light, namely, the excitons radiate light.

Since METHOD FOR MANUFACTURING MULTI-LAYER THIN FILM OLED BY VACUUM EVAPORATION was published by Doctor Qingyun Deng in 1987, the OLED has been attracted extensive attention and widely researched in both educational circles and industrial circles. However, many problems remain to be improved at present, in which how to improve the light extraction efficiency of the OLED is still one of key points. At present, to improve the light extraction efficiency, there are generally two methods: one method is to improve internal quantum efficiency, while the other method is to improve external quantum efficiency. When photons are incident on the surface of photosensitive equipment, a part of the photons will be absorbed and thus excite the photosensitive material to generate electron hole pairs so as to form current. In this case, a ratio of the number of the generated electrons to the number of the absorbed photons is the internal quantum efficiency, and a ratio of the number of the generated electrons to the number of all the incident photons is the external quantum efficiency.

The internal quantum efficiency mainly measures a ratio of the number of a part of excitons, which are generated during recombination of injected current carriers in a light-emitting layer and turned into photons for coupling luminescence to the total number of the excitons. The improvement of the internal quantum efficiency may be achieved by improving material performance, using phosphor materials or other ways. Theoretically, the luminescence with the internal quantum efficiency approximate to 100% may be reached.

To improve the external quantum efficiency is to improve the coupling light extraction efficiency of an OLED. For a flat panel display device, only about 20% of photons can be generally extracted out for the exciton luminescence, but the vast majority (80%) of energy is lost in various modes, such as a substrate mode occurring at refracting or reflecting boundaries between the anode of the OLED and a substrate or between the substrate and air, a waveguide mode occurring between the anode of the OLED and a light-emitting layer boundary, and a Surface Plasmon (SP) mode occurring near a metal electrode, wherein more than 40% of light is limited in an OLED due to the SP mode, light limited by the waveguide mode and light limited by the substrate mode are 15% and 23%, respectively. As the loss caused by metal absorption is 4%, only about 20% of light emitted from a light-emitting layer may transmit out from the OLED, then enters air and is thus seen by human eyes.

At present, the loss caused by the waveguide mode is reduced by additionally arranging a micro lens or a micro-cavity structure on the surface of a substrate, or the loss caused by the substrate mode is improved by additionally arranging an optical grating or photonic crystal on a substrate to reduce total reflection, or the light extraction efficiency is improved by Bragg diffraction or other technologies. However, the micro lens generally only can realize the improvement of the light extraction efficiency in the illumination field, but is still not beneficial in the display field at the level of pixels having fine size. The use of the micro-cavity structure generally will result in the deviation of the outgoing light color of the OLED and a narrower angle of view, and the photonic crystal requires a complicated photo-etching process, is difficult to be prepared and realized, and meanwhile may further cause color offset and other problems of view angle due to the presence of optical gratings and the like. The Bragg diffraction technology generally requires that emergent light is adjusted by alternately laminating multiple layers of materials having high and low refractivity with thicknesses of high precision; meanwhile, different light-emitting colors (such as red R, green G and blue B) require different best thicknesses of Bragg diffraction layers, so the precise adjustment of the thicknesses of RGB must be realized by multiple steps of depositions, mask exposures and etching processes, which has large difficulty, low yield and high cost for the preparation technology of full-color OLED display devices.

It can be seen from the above that how to couple out light lost by the SP mode having the largest loss ratio is a method for effectively improving the external quantum efficiency of an OLED device; meanwhile, for a full-color OLED display device, how to use a simple and practical method to improve the light extraction efficiency of red, green and blue sub-pixels at the same time is also a technical problem urgent to be solved in the OLED field at present.

SUMMARY OF THE INVENTION

In view of the above-mentioned deficiencies of the present organic light-emitting diodes, the present invention provides an organic light-emitting diode, an array substrate and a preparation method thereof, and a display device. The organic light-emitting diode has high external quantum efficiency and thus has high light extraction efficiency.

A technical solution employed by the present invention is an organic light-emitting diode, including an anode, a cathode, a light-emitting layer disposed between the anode and the cathode, and a hole injection layer disposed between the anode and the light-emitting layer, wherein the hole injection layer is provided therein with metal nanoparticles, and frequency of localized surface plasmon resonance of the metal nanoparticles is matched with emission wavelength of the light-emitting layer.

Preferably, particle size of the metal nanoparticles ranges from 1 nm to 100 nm.

Preferably, doping concentration of the metal nanoparticles in the hole injection layer ranges from 1% to 20%.

Preferably, the metal nanoparticles are made from any one of gold, silver and aluminum, or an alloy of any one of gold, silver and aluminum, or any combination of gold, silver and aluminum.

Preferably, the metal nanoparticles are in shape of any one or any combination of a spherical shape, a prismatic shape, a cubic shape, a cage shape and a core-shell structure.

Preferably, the metal nanoparticles are prepared by a sputtering method, an evaporation method, a photoetching method, a hydrothermal method, a chemical synthesis method or an electrochemical method.

Preferably, the hole injection layer is formed by a mixed system of ink for forming the hole injection layer and the metal nanoparticles in an inkjet printing manner.

Preferably, the hole injection layer comprises a first hole injection sub-layer and a second hole injection sub-layer, the metal nanoparticles being disposed in the first hole injection sub-layer, the second hole injection sub-layer being closer to the light-emitting layer relative to the first hole injection layer.

A technical solution employed by the present invention is an array substrate, which is divided into a plurality of sub-pixel regions, each of the sub-pixel regions being provided therein with an organic light-emitting diode, wherein the organic light-emitting diode is the organic light-emitting diode above-mentioned.

Preferably, the array substrate includes a red organic light-emitting diode, a green organic light-emitting diode and a blue organic light-emitting diode, the red organic light-emitting diode, the green organic light-emitting diode and the blue organic light-emitting diode being successively disposed in three adjacent sub-pixel regions, respectively, wherein the metal nanoparticles in the hole injection layer of the red organic light-emitting diode are silver ellipsoids having a major-to-minor axis ratio of 9.5-10.5;

the metal nanoparticles in the hole injection layer of the green organic light-emitting diode are silver ellipsoids having a major-to-minor axis ratio of 1.5-2.5; and the metal nanoparticles in the hole injection layer of the blue organic light-emitting diode are silver ellipsoids having a major-to-minor axis ratio of 2.8-3.8.

Preferably, each of the sub-pixel regions is further provided therein with a thin film transistor for driving the organic light-emitting diode, and a drain of the thin film transistor is connected to the anode of the organic light-emitting diode.

A technical solution employed by the present invention is a display device, including the above-mentioned array substrate.

A technical solution employed by the present invention is a preparation method of an array substrate, the array substrate being divided into a plurality of sub-pixel regions, each of the sub-pixel regions being provided therein with an organic light-emitting diode, the preparation method comprising steps of: forming an anode and a cathode of the organic light-emitting diode, forming a light-emitting layer between the anode and the cathode and forming a hole injection layer between the anode and the light-emitting layer, wherein metal nanoparticles are formed in the hole injection layer, and frequency of localized surface plasmon resonance of the metal nanoparticles is matched with emission wavelength of the light-emitting layer.

Preferably, the step of forming the hole injection layer comprises:

preparing metal nanoparticles of different particle sizes or shapes or compositions;

uniformly mixing the metal nanoparticles with ink for forming the hole injection layer to form a mixed system; and spraying the mixed system in the sub-pixel regions in an inkjet printing manner, and then drying to form the hole injection layer containing the metal nanoparticles.

Preferably, the sub-pixel regions include a red sub-pixel region, a green sub-pixel region and a blue sub-pixel region, wherein the mixed system containing the metal nanoparticles with a localized surface plasmon resonance peak at a red wavelength is sprayed in the red sub-pixel region to form a red organic light-emitting diode;

the mixed system containing the metal nanoparticles with a localized surface plasmon resonance peak at a green wavelength is sprayed in the green sub-pixel region to form a green organic light-emitting diode; and the mixed system containing the metal nanoparticles with a localized surface plasmon resonance peak at a blue wavelength is sprayed in the blue sub-pixel region to form a blue organic light-emitting diode.

Preferably, the metal nanoparticles are prepared by a sputtering method, an evaporation method, a photoetching method, a hydrothermal method, a chemical synthesis method or an electrochemical method.

Preferably, the metal nanoparticles are uniformly mixed with the ink for forming the hole injection layer by an ultrasonic method or a chemical modification method to form the mixed system.

In the organic light-emitting diode of the present invention, by doping metal nanoparticles in the hole injection layer and allowing the frequency of localized surface plasmon resonance of the metal nanoparticles to be matched with the emission wavelength of the light-emitting layer, the metal nanoparticles and photons emitted from the light-emitting layer are allowed to generate localized surface plasmon resonance, so that the external quantum efficiency of the organic light-emitting diode is improved, the light extraction efficiency of the organic light-emitting diode is enhanced, the light extraction efficiency of the array substrate is thus enhanced, and the display effect of the display device is further ensured; meanwhile, the formation of the hole injection layer in an inkjet printing manner is simple and practical, simplifies preparation process and improves preparation efficiency.

REFERENCE NUMERALS

1: anode; 2: light-emitting layer; 3: cathode; 4: hole injection layer; 5: electron injection layer; 6: metal nanoparticle; 7: hole transfer layer;
10: substrate; 11: thin film transistor; 12: resin layer; 131: first pixel defining wall; 132: second pixel defining wall;
20: spray gun.

DETAILED DESCRIPTION OF THE EMBODIMENTS

To make those skilled in the art better understand the technical solutions of the present invention, an organic light-emitting diode, an array substrate and a preparation method thereof and a display device of the present invention will be further described as below in detail in conjunction with the drawings by specific embodiments.

Embodiment 1

Figure 1:
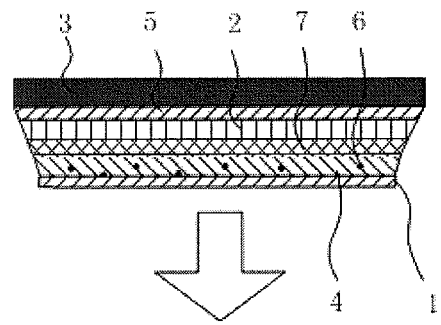
FIG. 1 is a schematic diagram of a structure of an organic light-emitting diode according to Embodiment 1 of the present invention.

Referring to FIG. 1, this embodiment provides an organic light-emitting diode. The organic light-emitting diode includes an anode 1, a cathode 3, a light-emitting layer 2 disposed between the anode 1 and the cathode 3, and a Hole Injection Layer (HIL) 4 disposed between the anode 1 and the light-emitting layer 2, the hole injection layer 4 is provided therein with metal nanoparticles 6, wherein the frequency of localized surface plasmon resonance of the metal nanoparticles 6 is matched with the emission wavelength of the light-emitting layer 2.

The metal nanoparticles 6 are generally made from inert noble metals, for example, any one of gold, silver and aluminum, or an alloy of gold, silver and aluminum, or any combination of gold, silver and aluminum. The shape of the metal nanoparticles 6 is any one or any combination of a spherical shape, a prismatic shape, a cubic shape, a cage shape and a core-shell structure.

Preferably, the range of particle size of the metal nanoparticles 6 in the hole injection layer 4 is 1 nm to 100 nm. The principle of selection of the particle size is as follows: the frequency of Localized Surface Plasmon (LSP) resonance of the metal nanoparticles should be basically consistent with the emission wavelength of the light-emitting layer in the OLED, so that the maximized LSP resonance enhancement effect is obtained.

Figure 2:
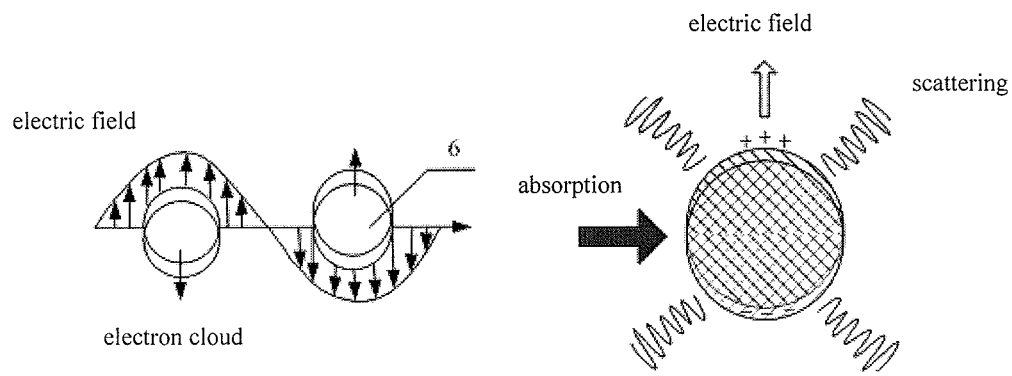
FIG. 2 is a schematic diagram of surface plasmon resonance of metal nanoparticles according to Embodiment 1 of the present invention.

Surface Plasmon (SP) refers to an electron dilatational wave, which is generated by the interaction between freely vibrated electrons existing on a metal surface after being excited by electrons or light waves and electrons or photons and propagated along the metal surface. The electron dilatational wave is an electromagnetic surface wave which may transversely limit light waves within a dimension range of sub-wavelength, has a planar dispersion curve and large photon mode density near an approximate-resonance frequency and may enhance their spontaneous radiation while interacting with surrounding media thereof. The electron dilatational wave has the strongest electric field on the surface, and has an exponentially decayed field in a direction vertical to a boundary. If the metal surface is very rough or the surface plasmon is near curved surface structures (such as a sphere or a cylinder) of the metal, the surface plasmon cannot be propagated along a boundary in the form of waves but is limited near the surfaces of these structures, i.e., the surface plasmon is localized, in this case, the surface plasmon SP is called localized surface plasmon LSP. When the metal particles having a size approximate to or less than the light wavelength are irradiated by light, an oscillating electric field allows the electron cloud of the metal particles to generate a displacement relative to an atomic core. The Coulomb attraction between the electron cloud and the atomic core generates resilience to cause oscillation of the electron cloud around the atomic core. The collective oscillation of the electron cloud is called localized surface plasmon resonance. As shown in FIG. 2, a schematic diagram of the surface plasmon resonance of the metal nanoparticles is illustrated.

During the localized surface plasmon resonance, the electromagnetic field around the metal particles is greatly enhanced. In this case, each of the metal particles may be regarded as a nano-lens, while the oscillating plasmon is a photon which is fiercely limited within one nano-size particle. A significant effect brought by the localized surface plasmon resonance is as follows: under the fluorescent induction of excited photons (for example, light-emitting photons in the light-emitting layer), the localized surface plasmon generates radiation having a wavelength consistent with that of the fluorescent molecular radiation, and meanwhile increases the decay rate of radiation of the system, reduces the fluorescence lifetime of photons, increases the fluorescence quantum efficiency and enhances the fluorescence emission.

In the organic light-emitting diode of this embodiment, the hole injection layer 4 is doped with metal nanoparticles 6 therein. According to the principle of the localized surface plasmon resonance, the enhancement of the metal nanoparticles 6 to the external quantum efficiency $\eta_{ext}$ of the organic light-emitting device includes two parts: the first one is increasing a radiation inactivation rate and thus increasing the internal quantum efficiency; and, the second one is increasing the light extraction efficiency because the external quantum efficiency $\eta_{ext}$ is equal to the light extraction efficiency multiplied by the internal quantum efficiency. As the external quantum efficiency of the organic light-emitting diode may be greatly improved, test results show that the light extraction efficiency is also improved accordingly.

Specifically, the external quantum efficiency $\eta_{ext}$ of the organic light-emitting diode may be obtained according to formula (1):

$$\eta_{ext} = C'_{ext} h_{int} = C'_{ext} \frac{k_{rad}}{k_{rad} + k_{non}} \tag{1}$$

In formula (1), $C'_{ext}$ denotes the light extraction efficiency, and $h_{int}$ denotes the internal quantum efficiency. The internal quantum efficiency $h_{int}$ is determined by a ratio of the radiation inactivation rate $k_{rad}$ to the sum of the radiation inactivation rate $k_{rad}$ and the non-radiation inactivation rate $k_{non}$. At the normal room temperature, the radiation inactivation rate $k_{rad}$ of the organic light-emitting diode is larger than the non-radiation inactivation rate $k_{non}$, so an intermediate-level internal quantum efficiency $h_{int}$ is caused. In accordance to the principle proposed by Purcell in 1946 that the exciton radiation inactivation rate $k_{rad}$ is related to a photon state density, when a light-emitting center is in a micro-cavity of a wavelength order, the photon state density increases to cause increase of the spontaneous radiation rate of excitons, so that the ratio of radiation inactivation is improved, and the internal quantum efficiency of an OLED is improved by a localized surface plasmon LSP. Further, the light which is larger than a total internal reflection angle and cannot be radiated out in the light-emitting layer of the OLED may excite a localized surface plasmon LSP, and then allows it to be radiated out in the form of light, so that the light extraction efficiency of the OLED is improved by the localized surface plasmon LSP. It is thus clear that the internal quantum efficiency and light extraction efficiency of the OLED may be respectively improved by the localized surface plasmon LSP. According to formula (1), as the light extraction efficiency and the internal quantum efficiency are improved, respectively, the external quantum efficiency of the OLED is thus improved.

For the organic light-emitting diode shown in FIG. 1, excitons are recombined in the light-emitting layer 2 and then generate photons, and light is emergent from the bottom after passing through the hole injection layer 4 (or, and other organic layers, such as an electron injection layer 5) and the anode 1 (the OLED shown in FIG. 1 is a bottom emission type OLED). When an incident light field acts on the metal nanoparticles 6, electrons in the metal nanoparticles 6 will perform collective oscillation along with the incident light field, as shown in FIG. 2. When electron clouds are deviated from atomic cores, due to the interaction of the Coulomb attraction between the electron clouds and the atomic cores, the deviated electron clouds get close to the atomic cores again. Accordingly, the electron clouds are oscillated near the atomic cores, that is, the localized surface plasmon oscillation is performed. When the frequency of the incident light is consistent with the natural oscillation frequency of free electrons, the localized surface plasmon resonance is thus formed.

During the localized surface plasmon resonance, even a very small incident field may also cause a large resonance. When light acts on the metal nanoparticles 6 and generates localized surface plasmon resonance, light having a frequency equivalent to the plasmon oscillation frequency will be absorbed or scattered. In this case, the generated absorption is plasmon resonance absorption, and the generated scattering is plasmon resonance scattering. This collective oscillation of electrons is called dipole plasmon resonance. There may be more advanced oscillations, such as quadri-pole oscillation and multipole oscillation. Such plasmon resonance will significantly improve the local electrical fields around the metal nanoparticles 6.

In the organic light-emitting diode of this embodiment, the adjustment of the metal nanoparticles 6 to the optical properties mainly depends on the influences of the localized surface plasmon. When a light field having a certain frequency acts on the metal nanoparticles 6 to generate surface plasmon resonance, the metal nanoparticles 6 play a role in adjusting the optical properties to the maximum extent. The resonance frequency is mainly related to the electron density (metal type), effective electron quality, particle size, particle shape, particle surrounding media (or surrounding dielectric environment) or other factors of the metal nanoparticles. By adjusting the size, shape, surrounding media, order degree and the like of the metal nanoparticles 6, the characteristics of the surface plasmon resonance of the metal nanoparticles may be adjusted conveniently.

The influences of the particle size, particle compositions, particle shape and particle surrounding media on the surface plasmon resonance of the metal nanoparticles 6 will be specifically described as below.

(1) Influence of Particle Size

For the metal nanoparticles having a particle size far less than the incident wavelength (for example, gold particles of 12-13 nm), a static electric field is approximately satisfied, and dipole resonance plays a leading role and may be calculated and stimulated according to the Mie theory. For larger metal nanoparticles 6 (for example, gold particles larger than 25 nm), a high-order multipole effect plays a leading role, and absorption peaks move towards long waves. As the interacted wavelength of the light and the particle size are comparable, with the increase of the particle size, the electric field causes the non-uniform polarization of particles, and the plasmon peaks are broadened.

(2) Influence of Particle Compositions

Metal particles of different compositions will result in different frequency and density of localized plasmon resonance. For example, for Au—Ag alloy nanoparticles, with the increase of the molar percentage of gold, the absorption peak of the surface plasmon resonance of the particles is red-shifted (that is, the wavelength becomes longer and the frequency is reduced), and a linear relationship is formed between the absorption peak and the molar percentage of the gold. Due to the dependent relationship between the absorption wavelength and the alloy composition, the absorption peaks of the system may be adjusted to a particular wavelength for satisfying the requirements of optical applications.

(3) Influence of Particle Shape

The shape of the metal nanoparticles has a greater influence on the absorption characteristics of the surface plasmon. For example, for bar-shaped gold nanoparticles, a surface plasmon absorption peak will be split into two peaks: a longitudinal mode of oscillating along an axial direction of nano-bars and a transverse mode of oscillating vertical to the axial direction. The absorption peak in the transverse mode is near 520 nm and is consistent with the surface plasmon absorption peak of spherical particles, while the absorption peak in the longitudinal mode is red-shifted with the increase of a length-to-diameter ratio of the nano-bars. For another example, for spheroid silver nanoparticles having a volume consistent with that of a sphere of which the radius is 30 nm, the surface plasmon resonance peak is changed obviously with a major-to-minor axis ratio (i.e., a ratio of the maximum axis to the minimum axis) of the spheroid. When the major-to-minor axis ratio of the spheroid is about 10, the resonance peak is at about 650 nm; when the major-to-minor axis ratio of the spheroid is approximate to 2, the resonance peak is at about 520 nm; and, when the major-to-minor axis ratio of the spheroid is approximate to 3.33, the resonance peak is at about 460-475 nm.

(4) Influence of Particle Surrounding Media

The surrounding media includes the type of a solvent, the magnitude of polarity, the material of a substrate or underlayer and the like. In this embodiment, the surrounding media mainly refers to the material of the hole injection layer HIL in which the metal nanoparticles are located. In short, for a light-emitting photon having a common wavelength, a metal nanoparticle matched with the photon may be found, so that localized surface plasmon resonance is generated between the metal nanoparticle and the photon.

In the organic light-emitting diode of this embodiment, the concentration of the metal nanoparticles 6 doped in the hole injection layer 4 should have no negative effects on the electrical properties of the OLED, so the doping concentration of the metal nanoparticles 6 in the hole injection layer 4 is generally required to be controlled below 20% wt. For example, the range of the doping concentration of the metal nanoparticles 6 in the hole injection layer 4 is 1% to 20% to ensure that the electrical properties of the hole injection layer 4 will not be greatly influenced. The metal nanoparticles 6 in the hole injection layer 4 may be uniformly doped or non-uniformly doped. For example, the metal nanoparticles 6 may be embedded according to a regular pattern.

In the organic light-emitting diode of this embodiment, through the adjustment effects of the metal nanoparticles 6 in the hole injection layer 4 on the photons, i.e., the metal nanoparticles 4 being embedded into a light path of the OLED, on the one hand, the light extraction efficiency of the organic light-emitting diode may be enhanced by using the localized surface plasmon resonance effect; on the other hand, the light extraction efficiency is further improved by the light scattering effect.

During the preparation process of the organic light-emitting diode of this embodiment, for the hole injection layer 4 doped with the metal nanoparticles 6, the metal nanoparticles 6 with proper particle size and shape feature may be prepared and then fully mixed with ink for forming the hole injection layer 4, and the mixture is uniformly deposited to form a film according to a proper proportion in an ink jet printing manner, so that the hole injection layer 4 is formed. The features of the metal nanoparticles 6 and the distribution of the metal nanoparticles 6 in the hole injection layer 4 determine the characteristics of the surface plasmon resonance. This embodiment employs the inkjet printing technology to print the mixed ink containing the metal nanoparticles 6 into the sub-pixels to be formed with a film therein, and employs the localized surface plasmon resonance effect to enhance the external quantum efficiency of the OLED, so the preparation process is greatly simplified, and the preparation efficiency is improved.

During the preparation process of the organic light-emitting diode of this embodiment, the metal nanoparticles 6 are prepared at first; then, by a conventional preparation method of an OLED, the metal nanoparticles 6 are doped in the material for forming the hole injection layer 4 to complete the preparation of the hole injection layer; and, the preparation of the OLED is thus accomplished.

Specifically, the preparation method of the hole injection layer 4 containing the metal nanoparticles 6 is as below.

First, ink containing the metal nanoparticles 6 is prepared: the prepared metal nanoparticles 6 are pre-mixed with the ink for forming the hole injection layer 4 to obtain a hole injection layer mixed system, wherein the range of doping concentration of the metal nanoparticles 6 in the hole injection layer 4 is 1%-20%. The extinction spectrum of the metal nanoparticles 6 should be basically overlapped with the emission wavelength of the light-emitting layer of the OLED of a corresponding color, so that the LSP resonance occurs, and the effect of luminescence enhancement will be obvious.

Then, the hole injection layer 4 is formed: the hole injection layer mixed system containing the metal nanoparticles 6 is spray-printed in a formation region of the hole injection layer 4 in an inkjet printing manner, and then a thin film is formed after drying so as to obtain the hole injection layer 4 containing the metal nanoparticles 6. The minimum standard is that the doping proportion of the metal nanoparticles 6 will not allow reduction of the electrical properties of the organic light-emitting diode, and it is better that the optical properties of the organic light-emitting diode have the maximum gain.

Subsequently, the final OLED is obtained by a general OLED preparation flow.

Figure 3:
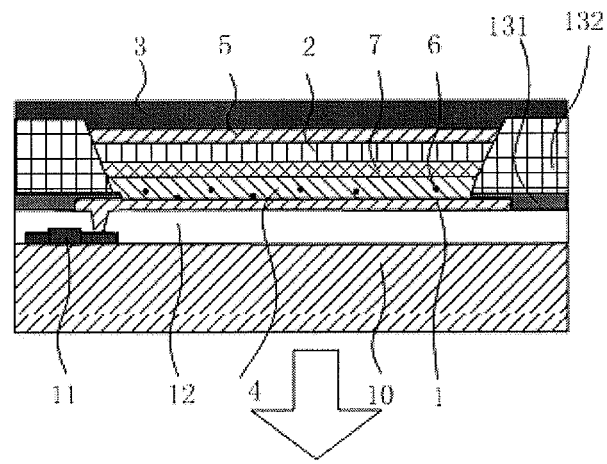
FIG. 3 is a schematic diagram showing the organic light-emitting diode in FIG. 1 is used as a sub-pixel in an array substrate.

Applied in the technical field of display, the OLED may be used as a sub-pixel in an array substrate. As shown in FIG. 3, the array substrate includes a substrate 10, and thin film transistors 11 and a resin layer 12 which are formed on the substrate 10. Pixel defining walls (a first pixel defining wall 131 and a second pixel defining wall 132 shown in FIG. 3) are further formed above the resin layer 12, so that the OLED is defined within a space formed by adjacent pixel defining walls.

In this embodiment, the used metal nanoparticles 6 generally need to be prepared in advance. The preparation method of the metal nanoparticles 6 is a sputtering method, an evaporation method, a photoetching method, a hydrothermal method, a chemical synthesis method or an electrochemical method, wherein the relatively efficient preparation method is the electrochemical method. The preparation of silver (Ag) nanoparticles and gold (Au) nanoparticles using an electrochemical synthesis method and a chemical reduction method will be further described as below in detail.

(1) Preparation of Ag Nanoparticles

A. Electrochemical Synthesis Method

A mixed solution obtained by mixing silver nitrate ($AgNO_3$), sodium citrate and potassium nitrate ($KNO_3$) in a certain proportion (the proper proportion may be selected according to the particle size of Ag nanoparticles required to be formed) is added into an electrochemical deposition pool.

Then, by using an ITO electric conductor (an anode electrode commonly used in electrochemistry) as a working electrode, platinum as a counter electrode and saturated calomel as a reference electrode, deposition is performed by a double-potential step method so as to obtain the Ag nanoparticles deposited on the surface of the ITO electric conductor.

The Ag nanoparticles are scrapped off from the surface of the ITO electric conductor by an external force so as to obtain dispersed Ag nanoparticle powder.

In the method, by controlling the concentration of an electrolyte, the step potential and the deposition time, the shape and size of the formed Ag nanoparticles may be well controlled, and the range of the particle size of the obtained Ag nanoparticles is 10 nm to 100 nm.

B. Chemical Reduction Method 0.5 ml of silver nitrate solution having a concentration of 0.1 mol/l is measured by a transfer pipette and then added into a flask containing 47.5 ml of high-purity water, and the mixture is stirred and heated to boiling.

2 ml of trisodium citrate having a mass percentage of 1% is added into a conical flask to react for 1 hour in a boiling state. The solution is gradually deepened from a colorless state, then turns into light brown and finally turns into dark green. At this time, the heating is stopped, and the system is cooled to the room temperature to obtain the required solution of spherical Ag nanoparticles.

Through microscopic measurement, the particle size of the Ag nanoparticles prepared by the chemical reduction method is distributed at about 76 nm.

By adjusting the proportion and reaction time of silver nitrate and trisodium citrate, the solution of Ag nanoparticles with different particle sizes may be obtained.

Figure 4:
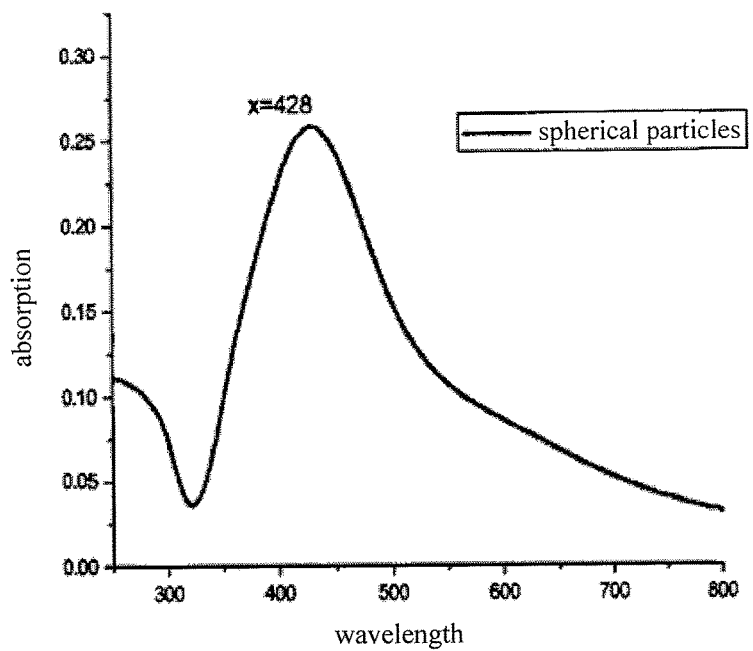
FIG. 4 is a schematic diagram of an extinction spectrum of silver nanoparticle solution according to Embodiment 1 of the present invention.

FIG. 4 shows an extinction spectrum of the solution of the spherical Ag nanoparticles prepared by the above-mentioned method. It can be seen that there is a largest plasmon resonance peak at about 428 nm, but the waveform is relatively broad and there is certain trailing at long waves. This may be because the prepared spherical Ag nanoparticles are accompanied with a small amount of other irregular nanoparticles to influence the surface plasmon resonance peak.

(2) Preparation of Au Nanoparticles

Chemical Reduction Method:

Au nanoparticles are generally prepared by a wet method, preferably a trisodium citrate reduction method using chloroauric acid. The standard preparation flow is as below.

A certain amount of pure water is added into a glass ware that is cleaned by nitromurlatic acid, eluted and dried, and then a certain amount of trisodium citrate solution is added.

The mixture is heated to boiling, then chloroauric acid solution is quickly added into the rapidly stirred trisodium citrate solution, and the mixture continues to be heated and stirred.

After heating and stirring are performed for several minutes, the heat source is removed, the stirring is stopped, and the mixture is cooled to the room temperature. After multiple times of centrifugation and washing, clean Au nanoparticles are collected.

By controlling the concentrations and the proportion of trisodium citrate and chloroauric acid, the particle size of the synthesized Au nanoparticles is adjusted. For example, when the concentration of trisodium citrate is 0.776 mol/l and the concentration of chloroauric acid is $2.13 \times 10^{-3}$ mol/l, the trisodium citrate and the chloroauric acid are mixed at a ratio of 1 ml to 20 ml (the usage amount of pure water is 200 ml), the diameter of the obtained Au nanoparticles is about 20 nm, and the peak of an absorption spectrum is at about 518 nm.

This embodiment provides an OLED having high external quantum efficiency, wherein the hole injection layer is provided therein with metal nanoparticles. The metal nanoparticles are coordinated with light-emitting photons in the light-emitting layer to generate a localized surface plasmon resonance enhancement effect when the resonance conditions are satisfied. Through the interaction between the localized surface plasmon formed by utilizing the surfaces of the metal nanoparticles and light-emitting molecules, the luminescent characteristics are adjusted, the loss caused by an SP mode is reduced, the external quantum efficiency of the device is enhanced, and the light extraction efficiency of the OLED is thus effectively improved. Meanwhile, as the hole injection layer is formed in an inkjet printing manner, in comparison to the optical grating or photon crystal method used for improving light extraction efficiency in the prior art, the manner of arranging the metal nanoparticles in the hole injection layer is simple and quick, does not need a complicated photoetching process and meanwhile does not cause color offset and other problems of view angle due to the presence of optical gratings and the like. In comparison to the Bragg diffraction technology used for improving light extraction efficiency in the prior art, the OLED of this embodiment is simple to be prepared, does not need complex material layers having high and low refractivity, and accordingly has no problems on requirements for thickness and thickness precision, so that the preparation difficulty is small, the preparation process is simplified and the preparation efficiency is improved.

Embodiment 2

This embodiment provides an OLED. The difference between this embodiment and Embodiment 1 lies in that the hole injection layer of the OLED in this embodiment has more than one sub-layers. For example, the hole injection layer includes a first hole injection sub-layer and a second hole injection sub-layer.

In this embodiment, the hole injection layer includes a first hole injection sub-layer and a second hole injection sub-layer. The metal nanoparticles are disposed in the first hole injection sub-layer, and the second hole injection sub-layer is closer to the light-emitting layer than the first hole injection sub-layer.

In this embodiment, the structure of the hole injection layer in the OLED is fine-adjusted locally, mainly involving the adjustment of a distance from the metal nanoparticles to a recombination luminescent region of excitons. In other words, the first hole injection sub-layer with metal nanoparticles embedded therein may be first formed by inkjet printing, then the second hole injection sub-layer without metal nanoparticles is printed above the first hole injection sub-layer, and a light-emitting layer is formed above the second hole injection sub-layer.

Compared with Embodiment 1, this embodiment may better realize the matching of wavelength and the maximized luminescence enhancement effect, so that the light extraction efficiency is greatly improved.

The preparation of the hole injection layer of the OLED in this embodiment still employs jet printing method. The preparation process of the OLED using this method is simple and quick, will not result in color offset and problems of view angle of the OLED, and has higher use value.

Embodiment 3

This embodiment provides an array substrate, including the OLED of Embodiment 1 or Embodiment 2.

Figure 5:
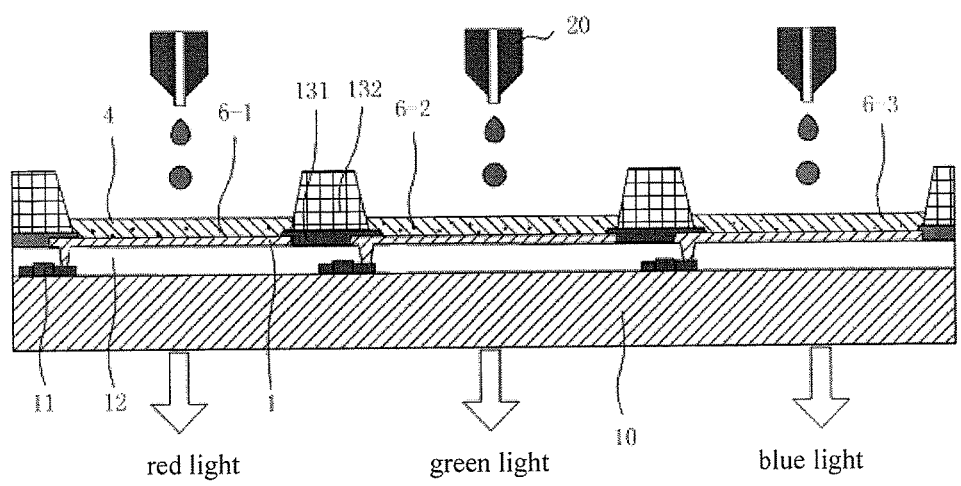
FIG. 5 is a schematic diagram of a structure of an array substrate according to Embodiment 3 of the present invention.

As shown in FIG. 5, the array substrate is divided into a plurality of sub-pixel regions. Each of the sub-pixel regions is provided therein with an organic light-emitting diode. The array substrate includes a red organic light-emitting diode, a green organic light-emitting diode and a blue organic light-emitting diode, the red organic light-emitting diode, the green organic light-emitting diode and the blue organic light-emitting diode being successively disposed in three adjacent sub-pixel regions, respectively.

In this embodiment, each of the sub-pixel regions is further provided therein with a Thin Film Transistor (TFT) for driving the organic light-emitting diode, the drain of the thin film transistor is connected to the anode of the organic light-emitting diode. FIG. 5 shows a structure of a common array substrate, having an active drive OLED, containing thin film transistors 11. The array substrate includes a substrate 10 and the thin film transistors 11 provided on the substrate 10, anodes 1 connected with the drains of the thin film transistors 11, a resin layer 12 playing insulating and flattening roles between the anodes 1 and the thin film transistors 11, pixel defining walls (in FIG. 5, each of which is composed of double-layer structures, i.e., a first pixel defining wall 131 and a second pixel defining wall 132) for limiting sub-pixel light-emitting regions, and organic layers of the OLEDs located above the anodes 1 and between the pixel defining walls. The organic layers include a hole injection layer 6, a hole transfer layer 7, a light-emitting layer 2, an electron injection layer 5 and a cathode 3.

The thin film transistors 11 on the array substrate may be of a top gate type or a bottom gate type. For a bottom emission type organic light-emitting diode, by driving the organic light-emitting diode by the thin film transistors 11, excitons are recombined in the light-emitting layer 2 and excite photons for emitting light. The light is emergent from the substrate 10 through the organic layers, the anodes 1, the opening portions of the sub-pixels and the like.

In this embodiment, a pixel includes a red sub-pixel, a green sub-pixel and a blue sub-pixel, so that full-color display may be realized. As the metal nanoparticles 6 filled in the hole injection layers 4 of OLEDs in different light-emitting sub-pixels are different in material composition, particle size (grain size), shape and other aspects, the range of particle size of the metal nanoparticles in the hole injection layers 4 is 1 nm to 100 nm. The selection principle of the particle size is that the LSP resonance frequency of the metal nanoparticles 6 should be basically consistent with the emission wavelength of the red, green and blue light-emitting sub-pixel regions of the OLEDs, that is, the maximized LSP resonance enhancement effect is obtained.

As a preferred solution, the metal nanoparticles in the hole injection layer of the red organic light-emitting diode are silver ellipsoids having a major-to-minor axis ratio of 9.5-10.5, the metal nanoparticles in the hole injection layer of the green organic light-emitting diode are silver ellipsoids having a major-to-minor axis ratio of 1.5-2.5, and the metal nanoparticles in the hole injection layer of the blue organic light-emitting diode are silver ellipsoids having a major-to-minor axis ratio of 2.8-3.8. For example, the metal nanoparticles in the hole injection layer of the red organic light-emitting diode are silver ellipsoids having a major-to-minor axis ratio of 10 (the volume is equal to that of a sphere the radius of which is approximate to 30 nm), the metal nanoparticles in the hole injection layer of the green organic light-emitting diode are silver ellipsoids having a major-to-minor axis ratio of about 2 (the volume is equal to that of a sphere the radius of which is approximate to 30 nm), or gold spheres the radius of which is approximate to 10 nm, and the metal nanoparticles in the hole injection layer of the blue organic light-emitting diode are silver ellipsoids having a major-to-minor axis ratio of 3.3 (the volume is equal to that of a sphere the radius of which is approximate to 30 nm). In the case that the metal nanoparticles 6 are properly selected, the energy of the surface plasmon of the metal nanoparticles 6 may be allowed to correspond to different wavelengths of the light emitted by the light-emitting layer 2, and the metal nanoparticles 6 in each sub-pixel may generate localized surface plasmon resonance together with light molecules emitted by the light-emitting layer 2 in this sub-pixel, so that the external quantum efficiency of the OLED is effectively enhanced, and the light extraction efficiency of the OLED is improved.

Based on the array substrate with the above-mentioned structure of the OLED, the hole injection layers 4 in sub-pixel regions of different colors (red, green and blue) in an organic light-emitting diode are doped with metal nanoparticles 6 of different particle sizes. Through the localized surface plasmon resonance effect of the metal nanoparticles, the external quantum efficiency of the organic light-emitting diode is enhanced, the light extraction efficiency of the organic light-emitting diode is effectively improved, and the light extraction efficiency of the array substrate is thus improved.

In the array substrate of this embodiment, the hole injection layer mixed systems containing metal nanoparticles of different particle sizes are sprayed in the red, green and blue sub-pixel regions still in an inkjet printing manner, and then hole injection layers containing the metal nanoparticles are obtained after drying.

As another aspect of the present invention, this embodiment further provides a preparation method of an array substrate. The array substrate is divided into a plurality of sub-pixel regions, and each of the sub-pixel regions is provided therein with an organic light-emitting diode. The preparation method includes steps of: forming an anode and a cathode of an organic light-emitting diode, forming a light-emitting layer between the anode and the cathode and forming a hole injection layer between the anode and the light-emitting layer, wherein metal nanoparticles are formed in the hole injection layer, and the frequency of localized surface plasmon resonance of the metal nanoparticles is matched with the emission wavelength of the light-emitting layer.

Preferably, the step of forming the hole injection layer includes:

preparing metal nanoparticles of different particle sizes or shapes or compositions;

uniformly mixing the metal nanoparticles with ink for forming the hole injection layer to form a mixed system; and spraying the mixed system in the sub-pixel regions in an inkjet printing manner, and then drying to form the hole injection layer containing the metal nanoparticles.

Preferably, the sub-pixel regions include a red sub-pixel region, a green sub-pixel region and a blue sub-pixel region, wherein the mixed system containing the metal nanoparticles with a localized surface plasmon resonance peak at a red wavelength is sprayed in the red sub-pixel region to form a red organic light-emitting diode, the mixed system containing the metal nanoparticles with a localized surface plasmon resonance peak at a green wavelength is sprayed in the green sub-pixel region to form a green organic light-emitting diode, and the mixed system containing the metal nanoparticles with a localized surface plasmon resonance peak at a blue wavelength is sprayed in the blue sub-pixel region to form a blue organic light-emitting diode.

Preferably, the preparation method of the metal nanoparticles includes a sputtering method, an evaporation method, a photoetching method, a hydrothermal method, a chemical synthesis method or an electrochemical method.

Preferably, the metal nanoparticles are uniformly mixed with the ink for forming the hole injection layer by an ultrasonic method or a chemical modification method to form the mixed system.

The specific preparation process of the array substrate is as follows: first, a resin layer 12, an anode 1 of an organic light-emitting diode and pixel defining walls (including a first sub pixel defining wall 131 and a second sub pixel defining wall 132) are formed on thin film transistors 11 successively.

Then, a hole injection layer mixed system containing metal nanoparticles 6 is prepared: the prepared metal nanoparticles 6 of different particle sizes (in FIGS. 5, 6-1, 6-2, and 6-3 denote different particle sizes) are mixed with ink for forming the hole injection layer 4, respectively, so as to obtain the hole injection layer mixed system, wherein the extinction spectrum of the metal nanoparticles 6 is basically overlapped with the emission wavelength of the light-emitting layer of the OLED of a corresponding color, so that it is likely to produce the localized surface plasmon resonance and the luminescence enhancement effect is obvious.

Subsequently, the hole injection layer 4 is formed: the hole injection layer ink containing metal nanoparticles 6 of different particle sizes is respectively coated in red, green and blue sub-pixel regions by inkjet printing equipment (for example, a spray gun 20 in FIG. 5) and then dried for forming a film so as to obtain the hole injection layer 4 containing the metal nanoparticles 6. The doping ratio of the metal nanoparticles 6 is appropriate based on the lowest standard that the electrical properties of the organic light-emitting diode are not reduced, and is better when the optical properties have the maximized gain.

Finally, the light-emitting layer 2, the electron injection layer 5 and the cathode 5 are formed so that the array substrate is formed.

In the array substrate of this embodiment, with respect to the requirement of simultaneously enhancing the light extraction efficiency of the OLEDs in the full-color red, green and blue sub-pixel regions, the hole injection layers in different sub-pixel regions are doped with metal nanoparticles of different particle sizes (for example, 6-1, 6-2 and 6-3 shown in FIG. 5), and the hole injection layer ink containing the metal nanoparticles is sprayed in the corresponding sub-pixels to form a film in an inkjet printing manner, so the purpose of simultaneously enhancing the external quantum efficiency of the red, green and blue sub-pixel regions is realized, and the light extraction efficiency of the array substrate is thus improved. Meanwhile, the formation of the hole injection layer in an inkjet printing manner is simple and practical, simplifies preparation process and improves preparation efficiency.

Specifically, in the array substrate of this embodiment, by enhancing the external quantum efficiency of an OLED, the light extraction efficiency of the array substrate is effectively improved, resulting in the following advantages:

(1) the method of enhancing the external quantum efficiency of an OLED by the Localized Surface Plasmon (LSP) resonance effect of the metal nanoparticles, in comparison to the method of improving light extraction efficiency and thus increasing external quantum efficiency by micro-cavity effects, has no problems of color offset (deviation of color) and view angle (the visible angle becomes narrower), and has no very strict control requirements for the thickness of the film layer during a micro-cavity preparation process, so that the array substrate may provide a better display effect; and (2) the metal nanoparticles of different particle sizes and the ink for forming the hole injection layer are together sprayed to form a film in an inkjet printing manner, so the preparation process is simple; with respect to the manner of changing the light extraction efficiency of an OLED by using Bragg diffraction layers of different thicknesses, the complexity of the manufacturing process due to the different Bragg diffraction layers corresponding to the sub-pixels of different colors (generally, it is required to perform multiple times of repeated deposition, exposure, developing, etching or other steps with respect to the sub-pixel regions of different colors) may be greatly omitted.

Embodiment 4

This embodiment provides a display device, including the array substrate of Embodiment 3.

The display device may be a mobile phone, a flat computer, a TV set, a display, a notebook computer, a digital photo frame, a navigator or any other product or component having display function.

As the display device of this embodiment has the array substrate of Embodiment 3 and the used array substrate has a better display effect, the corresponding display device also has a better display effect and a better visual effect.

Of course, the display device of this embodiment may further include other conventional structures, such as a power supply unit, a display driving unit and the like, and these structures will not be repeated here.

It should be understood that the foregoing embodiments are merely exemplary embodiments used for describing the principle of the present invention, but the present invention is not limited thereto. Those skilled in the art may make various variations and improvements without departing from the spirit and essence of the present invention, and these variations and improvements shall be contemplated as within the protection scope of the present invention.

The invention claimed is:

1. An organic light-emitting diode, comprising an anode, a cathode, a light-emitting layer disposed between the anode and the cathode, and a hole injection layer disposed between the anode and the light-emitting layer, wherein, the hole injection layer is provided therein with metal nanoparticles, and frequency of localized surface plasmon resonance of the metal nanoparticles is matched with emission wavelength of the light-emitting layer;

wherein the hole injection layer comprises a first hole injection sub-layer and a second hole injection sub-layer, the metal nanoparticles are disposed in the first hole injection sub-layer, the second hole injection sub-layer are disposed closer to the light-emitting layer relative to the first hole injection layer; and wherein doping concentration of the metal nanoparticles in the hole injection layer ranges from 1% to 20%.

2. The organic light-emitting diode according to claim 1, wherein particle size of the metal nanoparticles ranges from 1 nm to 100 nm.

3. The organic light-emitting diode according to claim 2, characterized in that wherein the hole injection layer comprises a first hole injection sub-layer and a second hole injection sub-layer, the metal nanoparticles are disposed in the first hole injection sub-layer, the second hole injection sub-layer are disposed closer to the light-emitting layer relative to the first hole injection layer.

4. The organic light-emitting diode according to claim 1, wherein the metal nanoparticles are made of any one of gold, silver and aluminum, or an alloy of any one of gold, silver and aluminum, or any combination of gold, silver and aluminum.

5. The organic light-emitting diode according to claim 4, wherein the hole injection layer comprises a first hole injection sub-layer and a second hole injection sub-layer, the metal nanoparticles are disposed in the first hole injection sub-layer, the second hole injection sub-layer are disposed closer to the light-emitting layer relative to the first hole injection layer.

6. The organic light-emitting diode according to claim 1, wherein the shape of the metal nanoparticles is any one or any combination of a spherical shape, a prismatic shape, a cubic shape, a cage shape and a core-shell structure.

7. The organic light-emitting diode according to claim 1, wherein the metal nanoparticles are prepared by a sputtering method, an evaporation method, a photoetching method, a hydrothermal method, a chemical synthesis method or an electrochemical method.

8. The organic light-emitting diode according to claim 1, wherein the hole injection layer is formed by a mixed system of ink for forming the hole injection layer and the metal nanoparticles in an inkjet printing manner.

9. The organic light-emitting diode according to claim 1, wherein the hole injection layer comprises a first hole injection sub-layer and a second hole injection sub-layer, the metal nanoparticles are disposed in the first hole injection sub-layer, the second hole injection sub-layer are disposed closer to the light-emitting layer relative to the first hole injection layer.

10. An array substrate having a plurality of sub-pixel regions, each of the sub-pixel regions being provided therein with an organic light-emitting diode, wherein the organic light-emitting diode is the organic light-emitting diode according to claim 1.

11. The array substrate according to claim 10, wherein the array substrate comprises a red organic light-emitting diode, a green organic light-emitting diode and a blue organic light-emitting diode, the red organic light-emitting diode, the green organic light-emitting diode and the blue organic light-emitting diode being successively disposed in three adjacent sub-pixel regions, respectively, wherein
the metal nanoparticles in the hole injection layer of the red organic light-emitting diode are silver ellipsoids having a major-to-minor axis ratio of 9.5-10.5;
the metal nanoparticles in the hole injection layer of the green organic light-emitting diode are silver ellipsoids having a major-to-minor axis ratio of 1.5-2.5; and
the metal nanoparticles in the hole injection layer of the blue organic light-emitting diode are silver ellipsoids having a major-to-minor axis ratio of 2.8-3.8.

12. The array substrate according to claim 10, wherein each of the sub-pixel regions is further provided therein with a thin film transistor for driving the organic light-emitting diode, and a drain of the thin film transistor is connected to the anode of the organic light-emitting diode.

13. A display device, comprising the array substrate according to claim 10.

14. A preparation method of an array substrate, the array substrate being divided into a plurality of sub-pixel regions, each of the sub-pixel regions being provided therein with an organic light-emitting diode, the preparation method comprising steps of: forming an anode and a cathode of the organic light-emitting diode, forming a light-emitting layer between the anode and the cathode and forming a hole injection layer between the anode and the light-emitting layer, wherein metal nanoparticles are formed in the hole injection layer, and frequency of localized surface plasmon resonance of the metal nanoparticles is matched with emission wavelength of the light-emitting layer;
wherein the hole injection layer comprises a first hole injection sub-layer and a second hole injection sub-layer, the metal nanoparticles are disposed in the first hole injection sub-layer, the second hole injection sub-layer are disposed closer to the light-emitting layer relative to the first hole injection layer; and
wherein doping concentration of the metal nanoparticles in the hole injection layer ranges from 1% to 20%.

15. The preparation method of an array substrate according to claim 14, wherein the step of forming the hole injection layer comprises:
preparing metal nanoparticles of different particle sizes or shapes or compositions;
uniformly mixing the metal nanoparticles with ink for forming the hole injection layer to form a mixed system; and
spraying the mixed system in the sub-pixel regions in an inkjet printing manner, and then drying to form the hole injection layer containing the metal nanoparticles.

16. The preparation method of an array substrate according to claim 14, wherein the sub-pixel regions comprise a red sub-pixel region, a green sub-pixel region and a blue sub-pixel region, wherein
the mixed system containing the metal nanoparticles with a localized surface plasmon resonance peak at a red wavelength is sprayed in the red sub-pixel region to form a red organic light-emitting diode;
the mixed system containing the metal nanoparticles with a localized surface plasmon resonance peak at a green wavelength is sprayed in the green sub-pixel region to form a green organic light-emitting diode; and
the mixed system containing the metal nanoparticles with a localized surface plasmon resonance peak at a blue wavelength is sprayed in the blue sub-pixel region to form a blue organic light-emitting diode.

17. The preparation method of an array substrate according to claim 14, wherein the metal nanoparticles are prepared by a sputtering method, an evaporation method, a photoetching method, a hydrothermal method, a chemical synthesis method or an electrochemical method.

18. The preparation method of an array substrate according to claim 14, wherein the metal nanoparticles are uniformly mixed with the ink for forming the hole injection layer by an ultrasonic method or a chemical modification method to form a mixed system.

\* \* \* \* \*